US006657448B2

(12) United States Patent
Hasegawa

(10) Patent No.: US 6,657,448 B2
(45) Date of Patent: Dec. 2, 2003

(54) ELECTRICAL CONNECTION APPARATUS

(75) Inventor: Yoshiei Hasegawa, Kanagawa-ken (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 65 days.

(21) Appl. No.: 09/760,247

(22) Filed: Jan. 12, 2001

(65) Prior Publication Data

US 2001/0016437 A1 Aug. 23, 2001

(30) Foreign Application Priority Data

Feb. 21, 2000 (JP) .......................................... 2000-043146
Jul. 25, 2000 (JP) .......................................... 2000-224051

(51) Int. Cl.[7] .............................................. G01R 1/073
(52) U.S. Cl. .......................................... 324/762; 324/754
(58) Field of Search ................................. 324/754, 755, 324/758, 761, 762, 765, 757, 760

(56) References Cited

U.S. PATENT DOCUMENTS 5,555,422 A * 9/1996 Nakano ....................... 324/754
5,625,298 A * 4/1997 Hirano et al. ................ 324/754
6,114,864 A * 9/2000 Soejima et al. .............. 324/754

FOREIGN PATENT DOCUMENTS

JP          05211218          8/1993
JP          08050146          2/1996

* cited by examiner

Primary Examiner—Ernest Karlsen
(74) Attorney, Agent, or Firm—Graybeal Jackson Haley LLP

(57) ABSTRACT

An electrical connection apparatus includes a lattice having a plurality of openings arranged in each of the X- and Y-directions intersecting with each other, and a probe sheet including a plurality of probe elements provided in each opening, each probe element having a contact portion. Each probe sheet is arranged on one surface side of the lattice such that the contact portion is positioned to correspond to the opening, and further, the probe sheet is divided into a plurality of probe regions which are separated from each other by one or more boundary portions defined between adjacent opening regions, each including one or more openings.

18 Claims, 17 Drawing Sheets

ELECTRICAL CONNECTION APPARATUS

BACKGROUND OF THE INVENTION

1. Field of the Invention

The present invention relates to an electrical connection apparatus for use in the inspection of a semiconductor device and more particularly to an electrical connection apparatus which makes use of a probe sheet.

2. Prior Art

Generally, a semiconductor device such as an integrated circuit (referred to as "IC" hereinafter) undergoes an electrical test (inspection) for judging whether or not the IC can work faithfully according to a given electrical performance specification. Such electrical test is usually carried out before a semiconductor wafer is separated into a plurality of individual IC chips by cutting, and this test is carried out by means of an electrical connection apparatus such as a probe card provided with a plurality of probes (or probe elements) having a pin point (contactor) each to be pressed on a plurality of corresponding electrodes formed on the IC chip, respectively.

One of the electrical connection apparatus of this kind makes use of a probe sheet including a plurality of probe elements arranged on an insulating film and a wiring board having an opening at its center. Each probe element has a contact portion to be pressed on the corresponding electrode of the IC chip. The probe sheet is fitted to one surface of the wiring board such that the contact portion of the probe element opposes to the opening of the wiring board.

In the prior art electrical connection apparatus like the above, however, the probe sheet is apt to sensitively react to the variation in the ambient temperature and the wafer temperature as well and to thermally expand and contract itself. As a result, the relative positional relation between contact portions themselves and the same between the contact portion and the corresponding electrode of the IC chip become different from the initially designed positional relation, thus some contact portions failing to make a right contact with predetermined corresponding electrode of the IC chip. Especially, in case of the burn-in test in which the wafer is tested in a heat chamber, or in case of the test in which a number of IC chips are tested at the same time, the temperature of the probe sheet rises too quickly to continue the test over a long period of time.

Therefore, it is a main purpose of the invention to provide an electrical connection apparatus for use in the electrical test of a flat plate-shaped object such as an IC chip, in which the relative positional mismatch between the contact portion and the corresponding electrode of the object under test can be obviated or at least minimized.

SUMMARY OF THE INVENTION

An electrical connection apparatus according to the invention includes a lattice having a plurality of openings arranged in each of the X- and Y-directions intersecting with each other, and a probe sheet including a plurality of probe elements of which each has a contact portion and is provided in each of the above openings. The probe sheet is arranged on one surface side of the lattice such that the contact portion is positioned so as to correspond to the opening. Furthermore, the probe sheet is divided into a plurality of probe regions which are separated from each other by one or more boundary portions defined between adjacent opening regions each including one or more openings.

When performing the electrical test on a flat plate-shaped object (referred to as "test-object" hereinafter) like an IC chip formed on the semiconductor wafer, the contact portion of each probe element is pressed on the corresponding electrode of the test-object and then the predetermined voltage and current are supplied thereto. When performing a heating test such as a burn-in test or an electrical test on a plurality of test-objects at the same time, the probe sheet comes to show the thermal expansion because of the temperature rise in the ambience, the semiconductor wafer, and the probe element itself.

In the electrical connection apparatus according to the invention, however, since the probe sheet is divided into a plurality of probe regions which are partitioned from each other by portions corresponding to the boundaries of each opening region, the thermal expansion of each probe element gives no influence to other probe elements adjacent thereto. Also, since the contact portion of the probe element is located so as to correspond to the opening of the lattice, the probe element, especially the relative positional relation of its contact portion, in its turn the relative positional relation of the contact portion against the electrode of the test-object is hardly influenced by the thermal expansion of the probe region. As a result, the relative positional mismatch due to the temperature rise between the contact portion and the electrode of the test-object becomes small.

Each contact portion includes a projection electrode projecting on the opposite side of the lattice. The projection electrode may be in the form of a circular cone or a pyramid. With this, when the projection electrode is pressed on the electrode of the test-object, the sharp top of the projection electrode pierces into the electrode of the test-object or scrapes off the oxide film formed around the electrode of the test-object, and thus the projection electrode can surely make an electrical connection with the electrode of the test-object.

Furthermore, the electrical connection apparatus may include a plurality of elastic members made of rubber or the like, each elastic member being arranged inside the aforementioned opening. The probe sheet may be fitted to the elastic member. With this, when pressing the contact portion on the electrode of the test-object, since the elastic member functions as a reaction body of the probe element, irregularity in the height of the contact portion is absorbed, and thus the contact portion can surely make an electrical connection with the electrode of the test-object.

Still further, the electrical connection apparatus includes a plurality of support members which are arranged on the other surface side of the lattice at a predetermined interval in either X- or Y-direction so as to extend in the other direction, in contact with the elastic members, and also includes a base plate to which the support members are fitted.

The lattice may be made of a material of which the thermal expansion coefficient is smaller than that of a semiconductor wafer. With this, the thermal expansion coefficient of the lattice is made smaller, thus the positional mismatch between the contact portion and the electrode of the test-object hardly taking place.

The support member may project from the lattice on the side opposite to the probe sheet.

The electrical connection apparatus may be further provided with a plurality of wires which make an electrical connection with the probe element and penetrates the lattice to extend further. With this, the electric signal or power for use in the test can be exchanged between the contact portion of the probe element and the electric circuit through this wire.

The electrical connection apparatus further includes one or more film-like connection base plates having a plurality of wirings each of which is connected with the wire as mentioned above. With this, the electric signal or power for use in the test can be exchanged between the contact portion of the probe element and the electric circuit through the wirings of the connection base plate. The wire may extend further, penetrating the base plate as described above.

An electrical connection apparatus further includes a plate-like elastic member arranged in each opening of the lattice and a plurality of support members arranged on the other surface side of the lattice at a predetermined interval in either the X- or Y-direction to extend in the other direction, and in contact with the elastic members. In this electrical connection apparatus, the support member has a groove opened extended in longitudinal direction of the support member and on the elastic member side to receive a part of the elastic members, each probe element extends in the manner of a cantilever with the help of one or more first slits formed in the probe sheet, and the elastic member has a plurality of second slits corresponding to the first slit at least in its portion received in the groove. With this, when the contact portion is pressed on the electrode of the test-object, the probe element formed in the manner of a cantilever is surely curved, thereby enabling the contact portion to surely make electrical contact with and move over the electrode of the test-object keeping the state of being pressed on the electrode of the test-object. Consequently, there is surely caused a rubbing action by the contact portion against the electrode of the test-object.

It is possible to form a space between both of a part of the elastic member and the bottom surface of the groove. With this, the contact portion can surely move with respect to the electrode of the test-object, thereby enabling a rubbing action by the contact portion against the electrode of the test-object.

The projection electrode has a conical or pyramidal shape, and the apex angle thereof has a value in the angular range of 100 through 175 degrees.

If such a projection electrode as described above is pressed on the electrode of the test-object, the apex portion of the projection electrode pierces into the electrode of the latter so that both electrodes are surely and electrically connected with each other. Furthermore, if the projection electrode is pressed on the electrode of the test-object, a certain horizontal component force comes to act on a part of the electrode of the test-object in the direction parallel thereto. However, since the apex angle of the contactor is 100 degrees or more, such horizontal component force is smaller than the component force vertically acting on the electrode of test-object, so that no rise-up or swell of the electrode material takes place.

If the apex angle of the contactor is less than 100 degrees, however, the component force applied in parallel with the test-object from among the force acting on the electrode of the test-object becomes so large that the rise-up or swell of the electrode material comes to take place. On the other hand, if the apex angle of the contactor exceeds 175 degrees, the rise-up or swell of the electrode material does not appear, but the apex portion of the projection electrode fails to pierce into the electrode of the test-object, which results in the incomplete electrical connection between the projection electrode and the electrode of the test-object.

As described above, according to the projection electrode of the invention, despite the fact that the sure electrical connection can be obtained between the projection electrode and the electrode of the test-object, there is prevented the rise-up or swell of the electrode material of the test-object which is caused by the pressure applied relatively between the projection electrode and the electrode of the test-object.

The projection electrode has a regular quadrilateral pyramidal shape, and its apex angle can have a value in the angular range of 100 through 165 degrees. With this, despite the fact that the sure electrical connection can be obtained between the projection electrode and the electrode of the test-object, there is surely prevented the rise-up or swell of the electrode material of the test-object which is caused by the pressure applied between the projection electrode and the electrode of the test-object.

The projection electrode has a polygonal pyramid shape with a plurality of slant planes, one slant line of which is directed to the displacement direction of the projection electrode when viewing it from the apex side of the projection electrode, the displacement being caused by the overdrive of the projection electrode. With this, the sure electrical connection can be attained between the projection electrode and the electrode of the test-object. Furthermore, even if the projection electrode makes a displacement with respect to the electrode of the test-object by the overdrive of the projection electrode, the displacement is made in the longitudinal direction of the above one slant line, so that the component force pushing a part of the test-object electrode in the displacement direction of the project electrode is made smaller. As a result, there is surely prevented the rise-up or swell of the electrode material of the test-object which is caused by the pressure applied between the projection electrode and the electrode of the test-object.

The projection electrode has a regular quadrilateral pyramidal shape, two opposing slant lines of which extend in the longitudinal direction of the probe element including the projection electrode when viewing them from the apex side of the contactor, and make the apex angle with a value in the angular range of 120 through 165 degrees. With this, the projection electrode can more surely make an electrical connection with the electrode of the test-object. Furthermore, even if the projection electrode makes a displacement with respect to the electrode of the test-object by the overdrive of the projection electrode, the displacement is made in the longitudinal direction of the above two slant lines, so that the component force pushing a part of the test-object electrode in the displacement direction of the project electrode is made smaller. As a result, there is surely prevented the rise-up or swell of the electrode material of the test-object which is caused by the pressure applied between the projection electrode and the electrode of the test-object.

The projection electrode has a regular quadrilateral pyramidal shape, two opposing slant planes of which are directed to the longitudinal direction of the probe element including the projection electrode when viewing them from the apex side of the projection electrode, and make the apex angle with a value in the angular range of 100 through 155 degrees. With this, the projection electrode surely can make electrical connection with the electrode of the test-object, and there is surely prevented the rise-up or swell of the electrode material of the test-object which is caused by the pressure applied between the projection electrode and the electrode of the test-object.

The projection electrode has a rhombic pyramidal shape with four slant lines, that is, two each of longer and shorter slant lines. Two opposing longer slant lines extend in the longitudinal direction of the probe element including the projection electrode when viewing them from the apex side of the projection electrode, and make an apex angle with a value in the angular range of 170 through 175 degrees. With this, despite the fact that the sure electrical connection can be obtained between the projection electrode and the electrode of the test-object, there is surely prevented the rise-up or swell of the electrode material of the test-object which is caused by the pressure applied between the projection electrode and the electrode of the test-object because two opposing slant lines extend in the displacement direction of the projection electrode with respect to the electrode of the test-object.

If the projection electrode has a rhombic pyramidal shape, the apex angle made by two opposing shorter slant lines has a value in the angular range of 125 through 135 degrees. With this, since the apex angle made by two opposing shorter slant lines is made acuter than the apex angle made by two opposing longer slant lines, the projection electrode pierces into the electrode of the test-object with ease. Despite of this, there is surely prevented the rise-up or swell of the electrode material of the test-object which is caused by the pressure applied between the projection electrode and the electrode of the test-object.

The projection electrode has an irregular rhombic pyramidal shape, two opposing slant planes of which are larger than the other two opposing slant planes with respect to the length from the bottom surface side of the pyramid to the apex thereof and are directed to the longitudinal direction of the probe element including the projection electrode when viewing them from the apex side of the projection electrode, and make an apex angle with a value in the angular range of 120 through 165 degrees. With this, despite the fact that the sure electrical connection can be obtained between the projection electrode and the electrode of the test-object, there can be surely prevented the rise-up or swell of the electrode material of the test-object which is caused by the pressure applied between the projection electrode and the electrode of the test-object.

The projection electrode can have a circular cone shape and have an apex angle with a value in the angular range of 120 through 165 degrees. With this, despite the fact that the sure electrical connection can be attained between the projection electrode and the electrode of the test-object, there can be surely prevented the rise-up or swell of the electrode material of the test-object which is caused by the pressure applied between the projection electrode and the electrode of the test-object.

The invention will now be described in detail with reference to the accompanying drawings which make up a part of this specification.

PREFERRED EMBODIMENTS OF THE INVENTION

Figure 1:
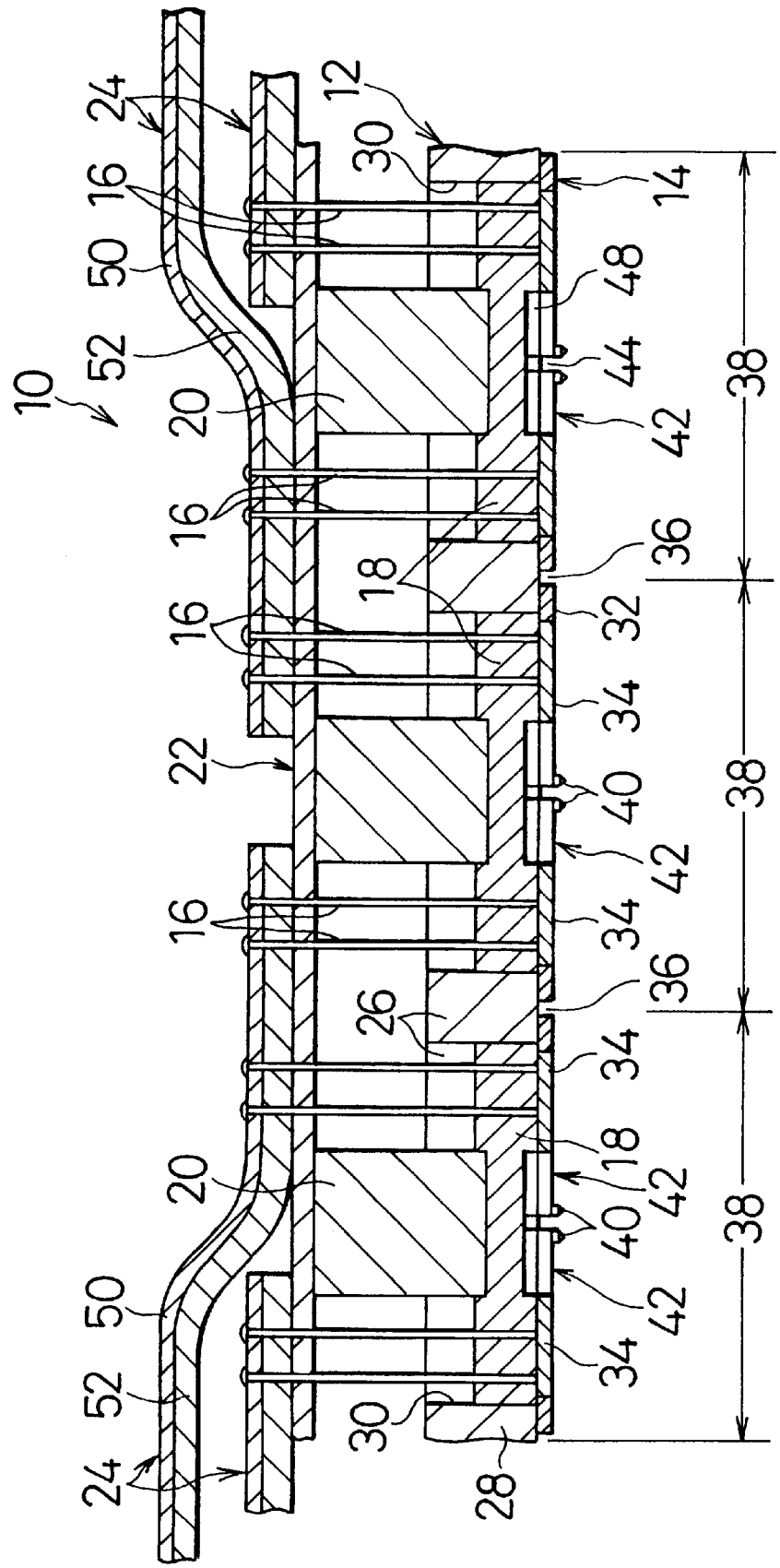
FIG. 1 is a cross sectional view showing an embodiment of an electrical connection apparatus according to the invention.
Figure 2:
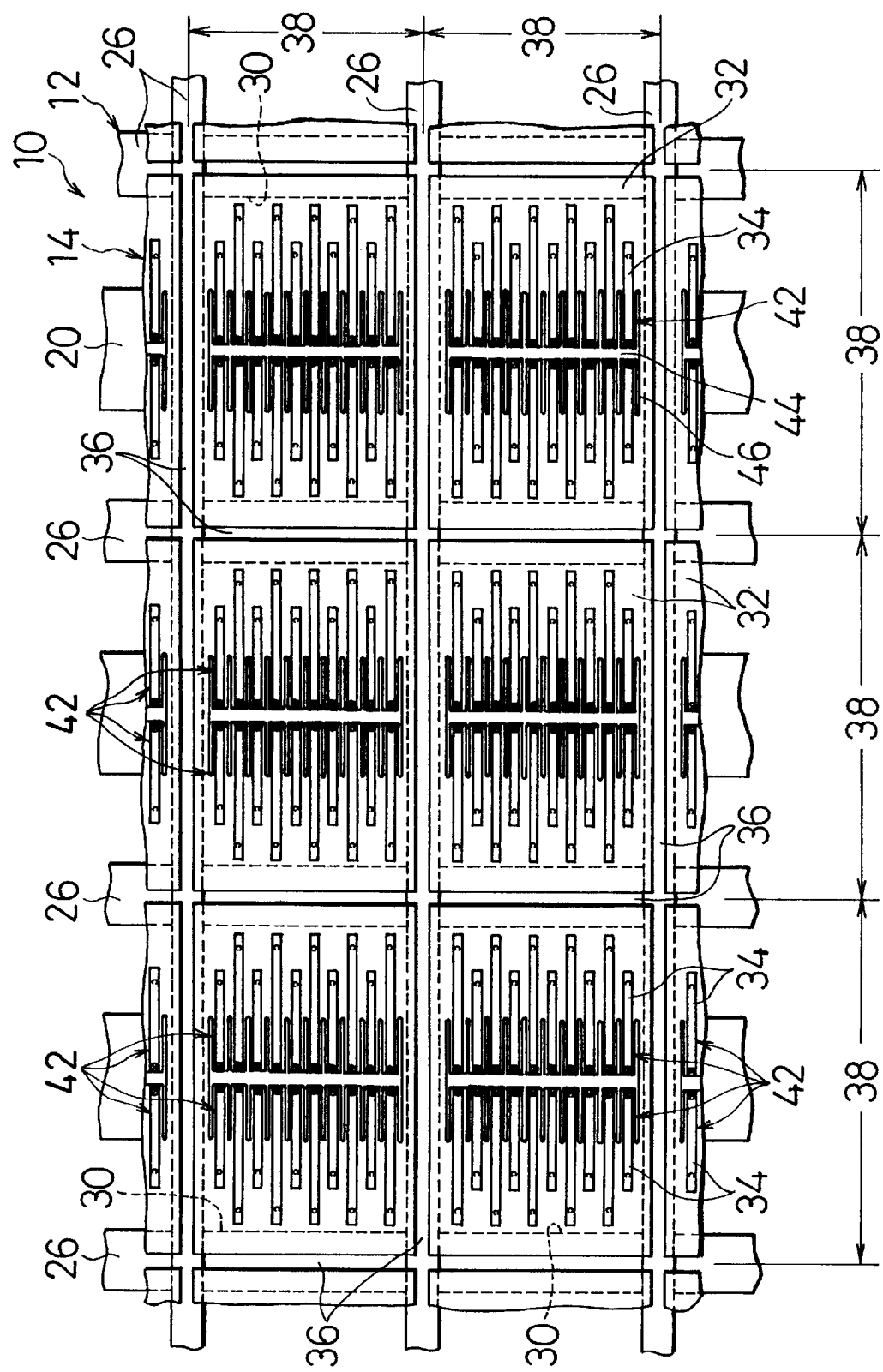
FIG. 2 is a bottom plan view of the electrical connection apparatus as shown in FIG. 1.
Figure 3:
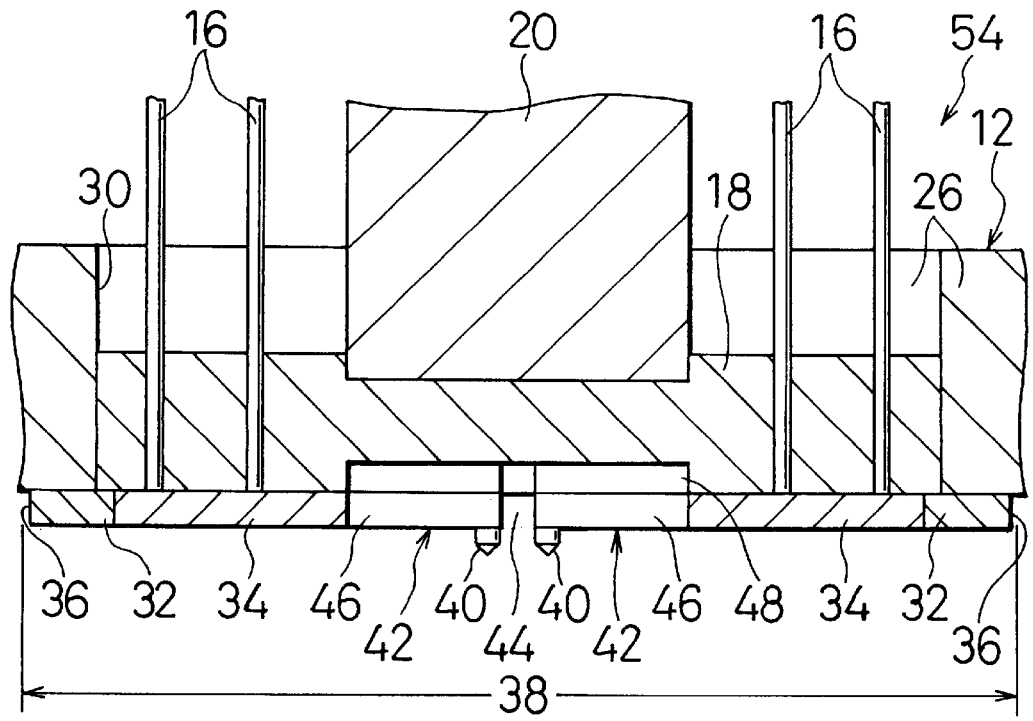
FIG. 3 is an enlarged sectional view showing the essential part of the electrical connection apparatus as shown in FIG. 1.
Figure 4:
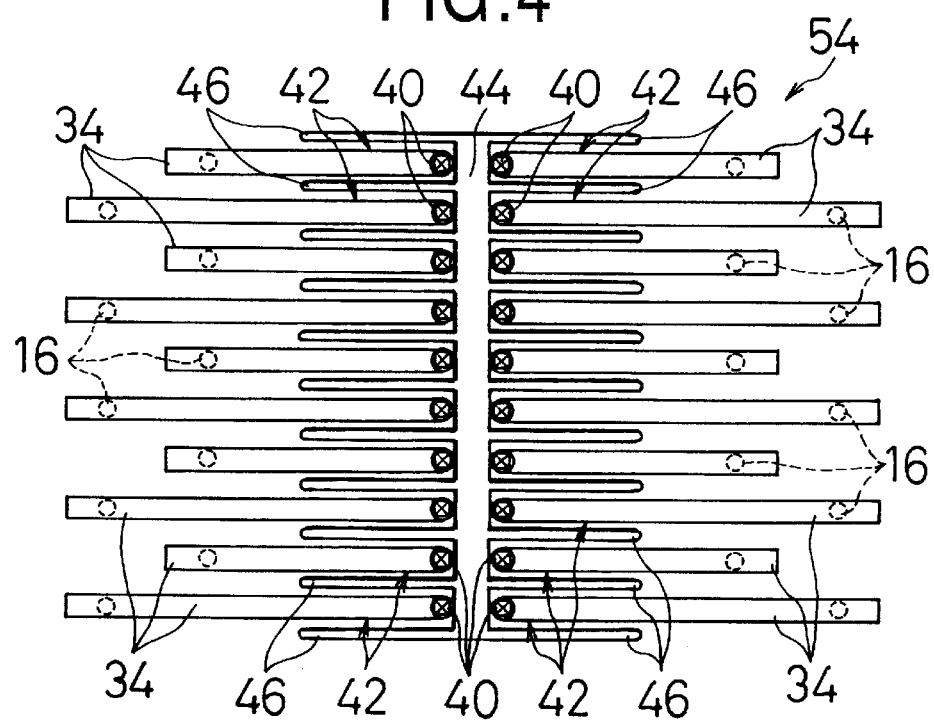
FIG. 4 is an enlarged bottom plan view of the essential part as shown in FIG. 3.
Figure 5:
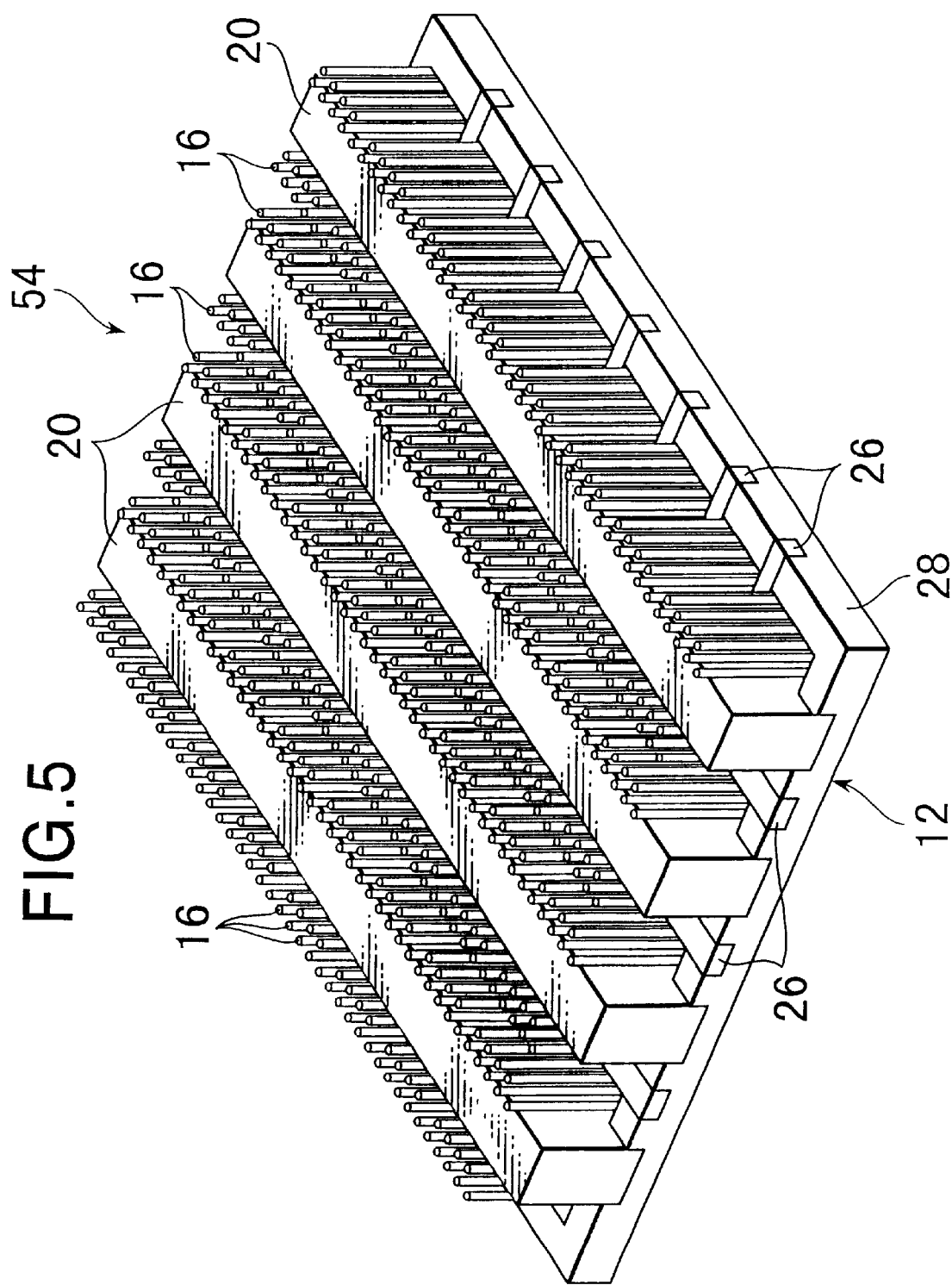
FIG. 5 is a perspective view showing a part of a probe unit.
Figure 6:
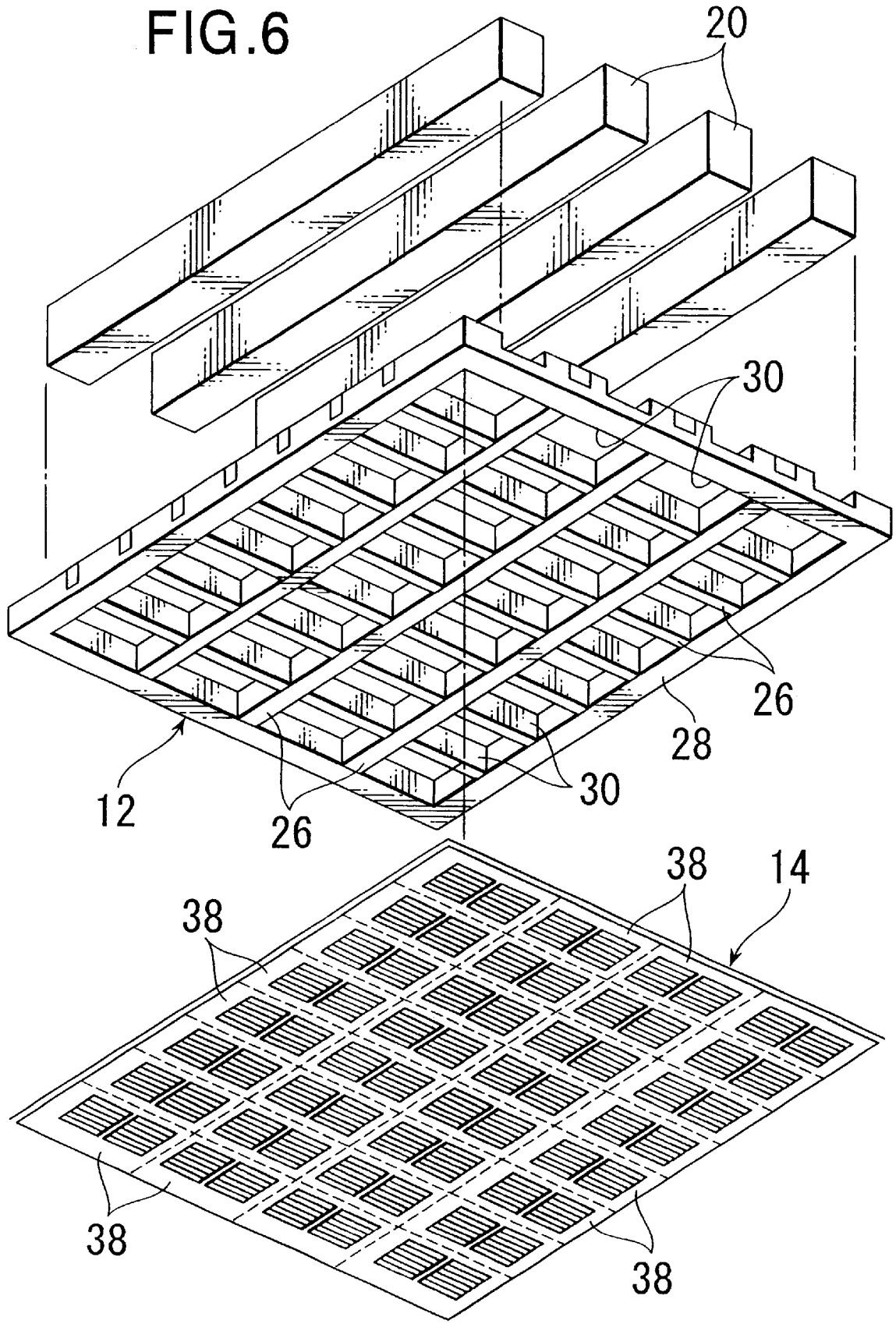
FIG. 6 is an exploded perspective view of the probe unit where an elastic member is omitted.
Figure 7:
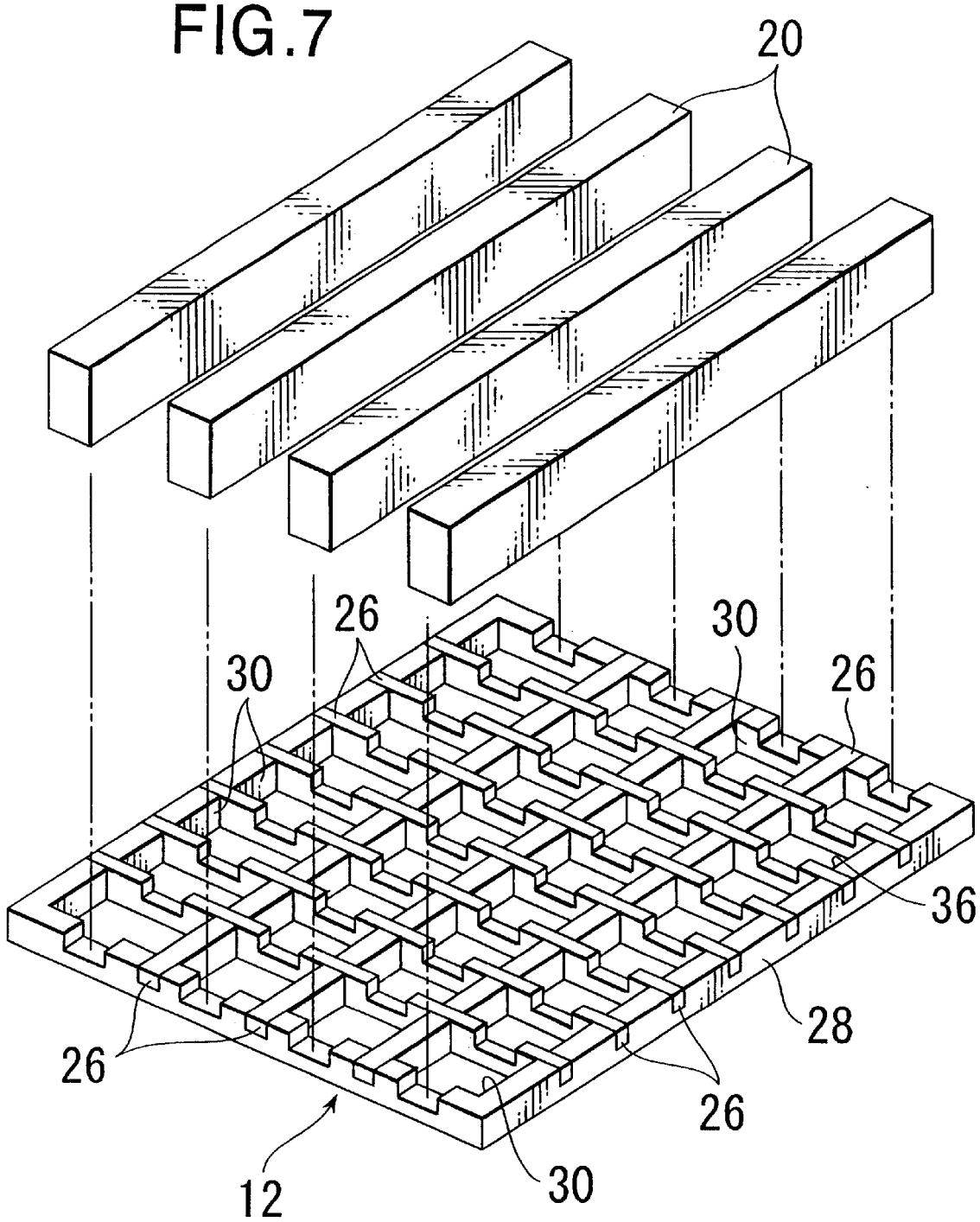
FIG. 7 is an exploded perspective view showing an assembled state of a lattice and a support member.
Figure 8:
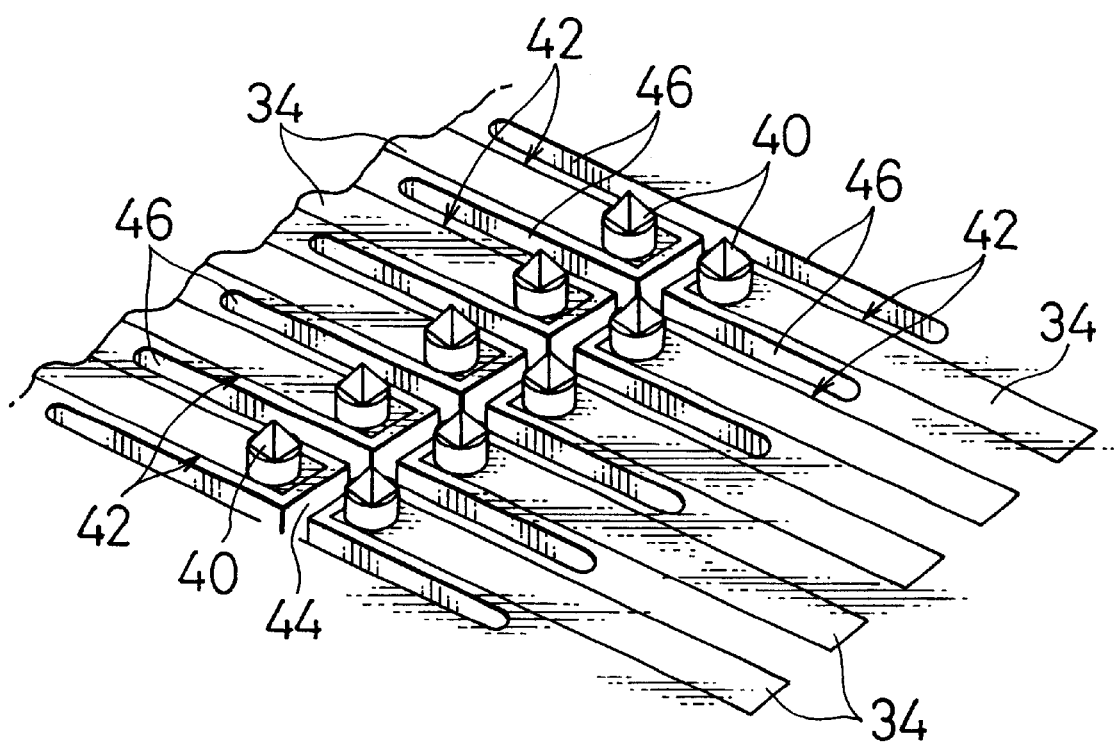
FIG. 8 is an enlarged perspective view of a probe element.

Referring to FIGS. 1 through 8, an electrical connection apparatus 10 illustrated therein is used as an apparatus for testing a plurality of IC chips formed on a semiconductor wafer at the same time before the wafer is cut into individual IC chips.

The electrical connection apparatus 10 includes a grating i.e. lattice 12, a probe sheet 14 fitted to one surface of the lattice 12 (on the lower surface side of the illustration), a plurality of wires 16 extending upward from the probe sheet 14, a plurality of elastic members 18 made of a rubber plate and arranged in the lattice 12, a plurality of elongated support members 20 arranged on the other surface side of the lattice 12, a base plate 22 on which the support members 20 are assembled, and a plurality of connection base plates 24 made of a filmy material.

The lattice 12 is formed by putting together a plurality of plate members 26 made of a proper material such as a metal inside a rectangular frame 28 so as to produce a plurality of rectangular openings 30 corresponding to the shape of the IC chip, which are arranged in the X- and Y-directions intersecting each other.

The probe sheet 14 includes a film 32 made of such an insulating resin as polyimide and a plurality of band-shaped wirings 34 made of conductive metal, both being integrally formed to make one flat surface. The probe sheet 14 is divided into a plurality of probe regions 38 separated from each other by means of a slit 36 which is formed in a position corresponding to the boundary portion of the adjacent openings 30 (i.e., corresponding to the position of the plate member 26 as illustrated) of the lattice 12. The slit 36 is formed in a part of the film 32.

Each probe region 38 has two wiring groups of which each includes a plurality of wirings 34 arranged at a predetermined space therebetween and extending in the same direction. Both wiring groups are arranged such that one end of the wiring 34 belonging to one wiring group opposes to the one end of the corresponding wiring 34 belonging to the other wiring group at a predetermined space. On one hand, the other end of each wiring 34 belonging to both wiring groups extends in the opposite direction to be away from its one end. Accordingly, respective one ends of the wirings 34 belonging to each wiring group are positioned to align along a virtual straight line.

Each wiring 34 of both wiring groups has a projection electrode 40 projecting downward at its one end. The projection electrode 40 is used as a contact portion of which the tip is pressed on the electrode of the IC chip. Each projection electrode 40 is illustrated as having a tip in the form of a right pyramid, but it may have a tip of the other form, for instance, a circular cone, a hemisphere, a mere projection, and so forth.

One end of each wiring 34 forms a probe element 42 together with a part of film 32 in the vicinity thereof and the projection electrode 40. Each probe region 38 includes a plurality of probe elements 42 and is adhered to the lower surface of the lattice 12 (plate member 26 and frame 28) through a part of the film 32.

Each probe element 42 is isolated from adjacent probe elements 42 by a slit 44 extending between both wiring groups and a slit 46 extending between one end portions of the adjacent wirings 34, and extends in the same manner as a cantilever. The slit 46 is formed in the part of the film 32. The probe element 42, especially the projection electrode 40 is located in a position corresponding to the opening 30.

Each wire 16 made of a conductive material is formed by means of the wire bonding technique and the like. The wire 16 is in correspondence with the wiring 34, in its turn, the probe element 42 and extends upward from the other end of the corresponding wiring 34, penetrating through the lattice 12, the elastic member 18, the base plate 22, and the connection base plate 24.

The probe sheet 14 as described above can be made by the following method which includes, for instance, the steps of forming an insulating film by applying an insulating synthetic resin to the base, forming a plurality of recesses corresponding to the wirings 34 and the projection electrodes 40 in the area of the insulating film by means of the etching technique using a photoresist, and forming the wirings 34 and the projection electrodes 40 by the plating using the electroforming method.

Each elastic member 18 is made in the form of a plate by using rubber such as silicone rubber and is received in the opening 30 of the lattice 12. Furthermore, each elastic member 18 includes a plurality of slits 48 communicating with the slits 44 and 46 of the probe sheet 14. Each elastic member 18 can be made by the following method including the steps of putting the probe sheet 14 in the lattice 12, forming the wire 16, pouring the rubber uncured (before curing) into the opening 30, and curing the rubber. With this, the probe sheet 14 and the elastic member 18 are bonded each other.

Slits 36, 44, and 46 of the probe sheet 14 may be formed along with the slit 48 of the elastic member 18 by adopting a suitable processing technique such as a laser processing, after fitting the probe sheet 14 to the lattice 12 and arranging the elastic member 18 in the lattice 12.

Each of support members 20 is made of a metallic material having a rectangular section. These support members 20 are fitted to the lattice 12 such that they are put in rows in either either the X- or Y-direction, preferably to be arranged at a predetermined space in the longitudinal direction of the wiring 34 and in the other direction, preferably extending in the arrangement direction of the probe elements 42 (i.e., the longitudinal direction of the slit 44) and coming in contact with the upper side of the elastic member 18. Each support member 20 projects upward from the lattice 12. The support member 20 can be fitted to the lattice 12 before the uncured rubber is vulcanized.

The base plate 22 is made of an insulating material such as a synthetic resin, a non-conductive metal, and so forth, and is fitted to the lower surface of the support member 20 with the help of a proper means, for instance, a plurality of screw members, an adhesive, and so forth.

Each connection base plate 24 is a filmy wiring base plate including a plurality of wirings 50 formed on one surface of the insulating film made of polyimide or the like, and one end portion of this wiring base plate is fitted to the base plate 22. The wiring 50 of each connection base plate 24 is arranged so as to make one-to-one correspondence with the wire 16 and is electrically connected with the corresponding wire 16 by using a conductive adhesive such as a solder. Each wiring 50 is connected with the electric circuit of a test equipment through such a proper means as a wiring board (not shown).

In the example as shown, each connection base plate 24 is fitted to the base plate 22 through the film 52 such that the wiring 50 stays on the upper side of the film 52. Therefore, each wire 16 penetrates the film 52 and the wiring 50 as well.

In the electrical connection apparatus 10, the support member 20 supports the lattice 12, the probe sheet 14, a wire 16, and the elastic member 18. The lattice 12, the probe sheet 14, a wire 16, the elastic member 18, and the support member 20 are used as a probe unit 54 (see FIG. 5) and are supported by the base plate 22.

When performing the electrical test of the IC chips formed on the semiconductor wafer, the projection electrodes 40 of each probe element 42 are pressed on the corresponding electrodes of the IC chip, and then, the predetermined voltage and current are applied thereto. In the electrical connection apparatus performing the heat test such as a burn-in test or the electrical test for testing a plurality of IC chips at the same time, the probe sheet 14 thermally expands due to the temperature rise in the atmosphere, the semiconductor wafer, and the probe element itself.

However, in case of the electrical connection apparatus 10 according to the invention, as the probe sheet 14 is divided into a plurality of probe regions 38 which are separated from each other at a place corresponding to the boundary portion of each opening 30, the thermal expansion of each probe region 38 does not give any influence to adjacent probe regions 38. Furthermore, as the probe element 42, especially the projection electrodes 40 are arranged to oppose to the opening 30 of the lattice 12, the relative positional relation of the probe element 42, especially, projection electrodes 40, in its turn, the relative positional relation between IC chip electrodes and corresponding projection electrodes 40 is not significantly affected by the thermal expansion of the probe region 38. As a result, the relative positional displacement between IC chip electrodes and corresponding projection electrodes 40 is hardly observed even if such a temperature rise as described above takes place.

In the electrical connection apparatus 10, the lattice 12 and the support member 20 are made of a material, for instance, "42 alloy" of which the thermal expansion coefficient is smaller than that of the semiconductor wafer. Therefore, the lattice 12 and the support member 20 indicate small expansion and contraction against the temperature variation, and the relative positional displacement between IC chip electrodes and corresponding projection electrodes 40 can be made smaller. The lattice 12 and the support member 20 may be made of the other material, for instance, "NOBINAITO" having a proper thermal expansion coefficient.

When the projection electrode is pressed on the corresponding electrode of the IC chip, the sharp tip of the projection electrode pierces into the IC chip electrode or scratches to break through the oxide film covering the IC chip electrode. With this, the projection electrode can make a sure electrical connection with the IC chip electrode.

When the projection electrode 40 is pressed on the IC chip electrode, the probe element 42 itself is elastically deformed by the overdrive of the projection electrode, and the elastic member 18 acts as a reaction body of the probe element 42. With this, if the projection electrodes 40 are a little different from each other in their height, such height difference is absorbed by the elastic deformation of the probe element 42 and the elastic member 18 as well, so that the sure electrical contact can be obtained between the projection electrode 40 and the IC chip electrode.

When the projection electrode 40 is pressed on the electrode of the IC chip, the support member 20 works to prevent the elastic member 18 from being excessively deformed. With this, the sure electrical contact can be maintained between the projection electrode 40 and the IC chip electrode.

Figure 9:
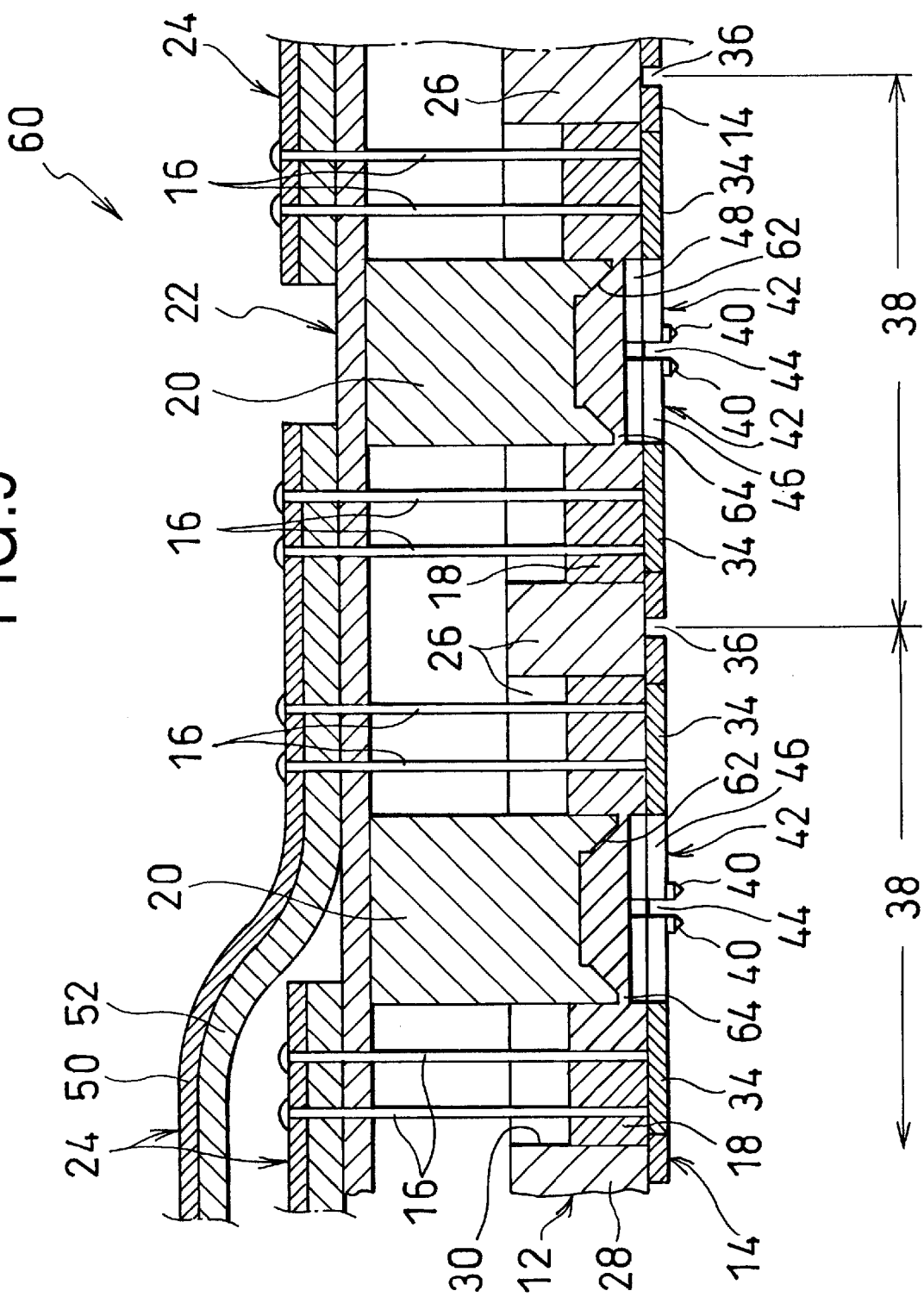
FIG. 9 is a cross sectional view showing the second embodiment of an electrical connection apparatus according to the invention.

Referring now to FIG. 9, an electrical connection apparatus 60 has a groove 62 formed on the lower surface of each support member 20, the groove 62 extending in the longitudinal direction of the support member 20 and being opened to the side of the elastic member 18. Each groove 62 has a section in the form of a trapezoid with its base gradually enlarged downward and accepts a part of the elastic member 18, especially the part corresponding to the probe element 42.

In the electrical connection apparatus 60, as a boundary portion 64 is put between the probe sheet 14 and the support member 20, it is hard for this boundary portion to make an elastic deformation, the boundary portion 64 being located between a part of the elastic member 18 corresponding to the probe element 42 extending in the manner of a cantilever and a part of the elastic member 18 corresponding to the other region of the wiring 34 except the probe element 42 (i.e., a part continuous with the base end portion of the probe element 42).

As the result, according to the electrical connection apparatus 60, when the projection electrode 40 as a contactor is pressed on the IC chip electrode, the probe element 42 formed in the manner of a cantilever is surely curved, thereby enabling the projection electrode 40 to make a sure electrical contact with and move over the IC chip electrode, keeping the state of pressing the IC chip electrode. Consequently, there is surely caused a rubbing action by the projection electrode 40 against the IC chip electrode.

Figure 10:
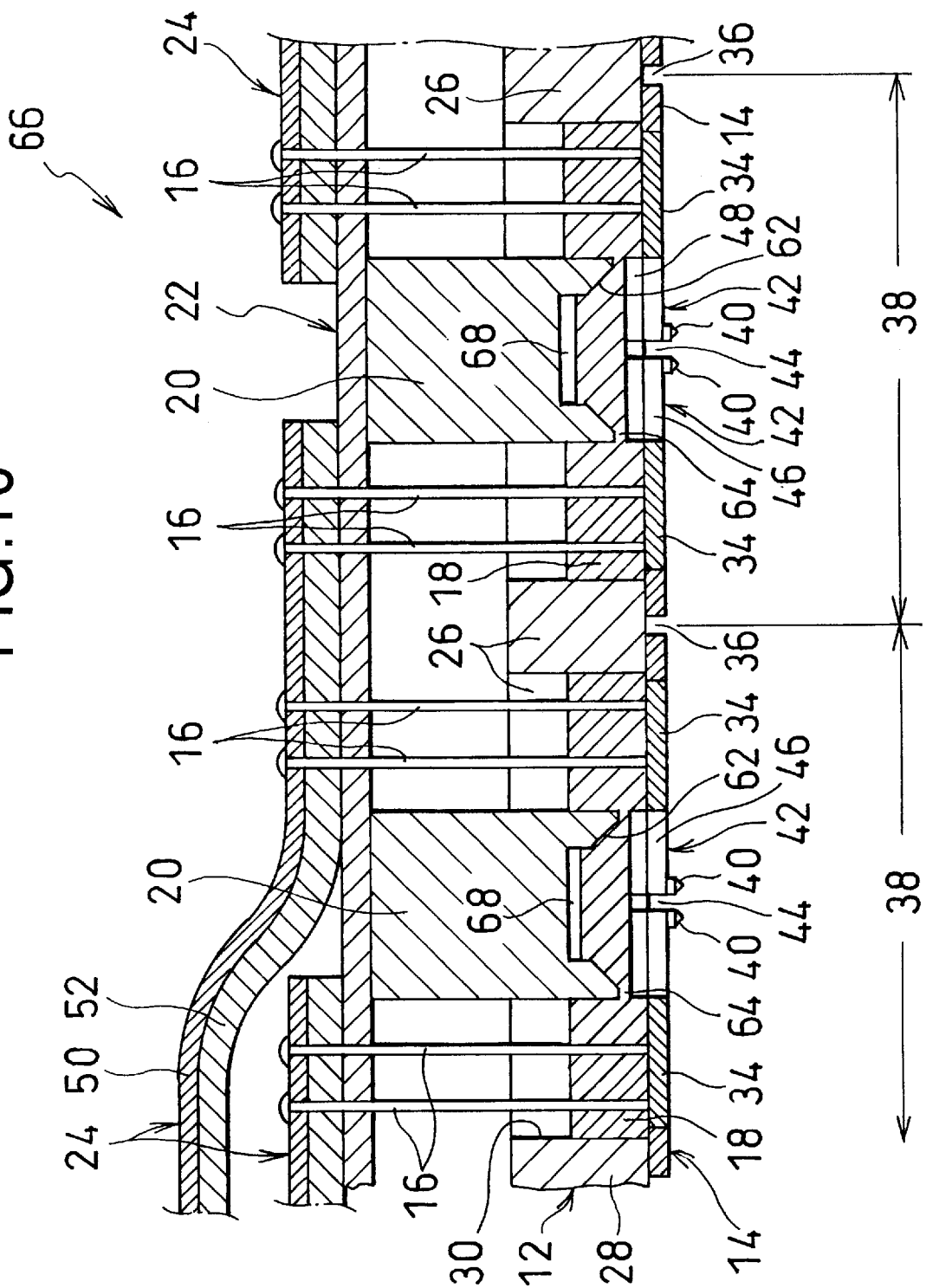
FIG. 10 is a cross sectional view showing the third embodiment of an electrical connection apparatus according to the invention.

In the electrical connection apparatus 60 as illustrated in FIG. 9, a part of the elastic member 18 received in the groove 62 is closely in contact with the bottom surface of the groove 62. However, like an electrical connection apparatus 66 as shown in FIG. 10, it may be allowed to form a space 68 between a part of the elastic member 18 received in the groove 62 and the bottom surface of the groove 62. If this is done, the projection electrode 40 as a contact portion may come to more surely move over the IC chip electrode. Therefore, there is caused a more sure rubbing action by the projection electrode 40 against the IC chip electrode.

In the embodiment as has been discussed so far, there has been used the probe sheet 14 in which the film 32 of the probe element 42 and the wirings 34 are arranged in the identical surface. However, it may be possible to use a probe sheet in which a plurality of wirings are arranged on at least one surface of the insulating film and the one end portion of each wiring and the vicinity thereof are used as a probe element. Furthermore, instead of using a probe sheet including elongated probe elements, it is possible to use a probe sheet in which probe elements arranged in the form of a circle or a polygon and the insulating film are arranged in the identical surface.

In the embodiment as has been discussed so far, projection electrodes 40 and probe elements 42 are arranged so as to make two lines respectively in each probe region 38. However, the arrangement of the projection electrode 40 and the probe element 42 in each probe region 38 has to be determined according to the arrangement of the electrodes of the IC chip to be inspected.

If the projection electrode acting as a contactor has a cone shape or a polygonal pyramid shape, it is preferable that the apex angle thereof be set within a predetermined angular range. An embodiment of a probe sheet 110 provided with such a contactor, that is, a projection electrode will be described in the following.

Figure 11:
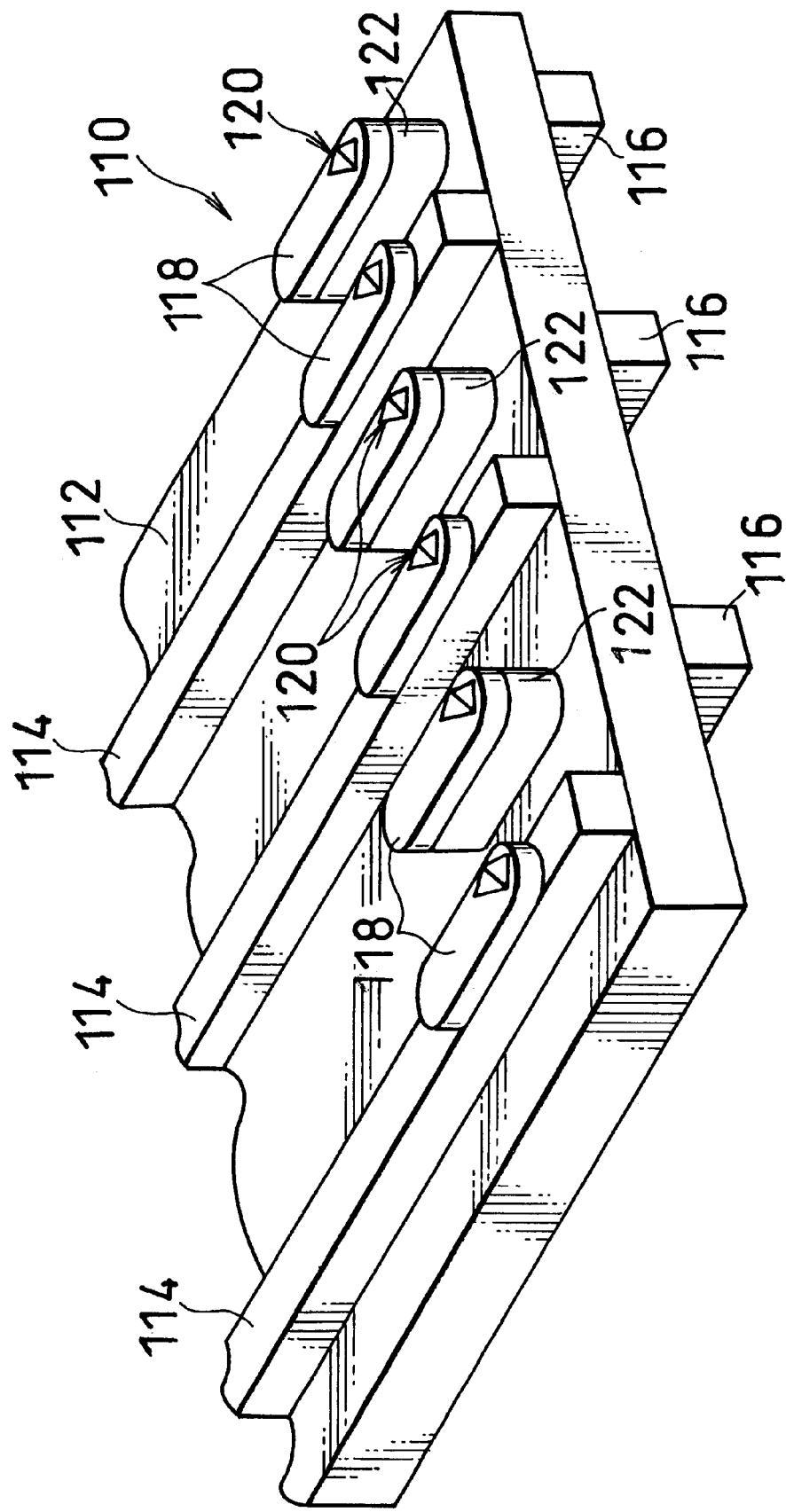
FIG. 11 is a perspective view showing in part an embodiment of a probe sheet according to the invention.
Figure 12:
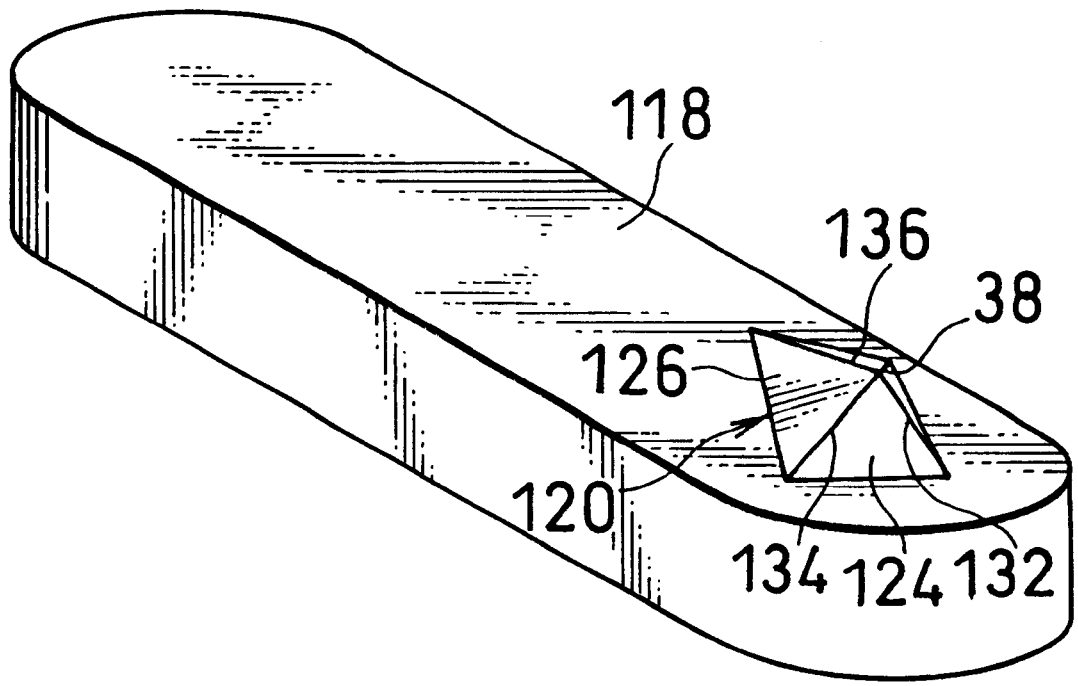
FIG. 12 is an enlarged perspective view of a seat and a projection electrode in the probe sheet as shown in FIG. 11.

Referring to FIGS. 11 and 12, the probe sheet 110 is used for the electrical test for testing an integrated circuit including a plate-like flat electrodes (i.e., pad electrodes).

The probe sheet 110 includes a sheet-shaped base member, that is, a film 112, a plurality of first wirings 114 arranged on one surface of the film 112, a plurality of second wirings 116 arranged on the other surface of the film 112, a plate-shaped seat member 118 fitted to one end portion of respective wirings 114 and 116, and a cone- or pyramid-shaped contactor, that is, a projection electrode 120 formed on each seat member 118 so as to project out therefrom.

The film 112 is a flexible and resilient film made of an insulating material such as polyimide. The first wirings 114 are arranged on one surface of the film 112 at a predetermined interval in the first direction and extend in the second direction intersecting the first direction at right angles. The second wirings 116 are arranged on the other surface of the film 112 at a predetermined interval in the first direction as if they are located between two each of the first wirings 114 and extend in the second direction when overlooking them, that is, in the top plan view of them.

Each seat member 118 has an flat elliptic shape extending in the longitudinal direction of the corresponding wiring 114 or 116. The seat member 118 provided on the first wiring 114 is fitted to one end portion of the wiring 114 in the longitudinal direction of the wiring 114 by using a conductive adhesive such as a solder. The seat member 118 provided on the second wiring 116 is fitted to one end portion of the wiring 116 in the longitudinal direction of the wiring 116 through an intermediate auxiliary member 122. The seat member 118 and the projection electrode 120 are integrally formed by plating, using the electroforming method.

The intermediate auxiliary member 122 made of a conductive material has the same flat elliptic shape as the seat member 118 and penetrates the film 112 in the direction of the thickness thereof so as to project upward from one surface of the film 112 by a distance (length) equivalent to the thickness of the first wiring 114. Each intermediate auxiliary member 122 is fitted to the corresponding seat member 118 by using a conductive adhesive such as a solder and is fitted to one end portion of the second wiring 116 in the longitudinal direction thereof on the other surface side of the film 112 by using a conductive adhesive such as a solder.

The probe sheet 110 is made up of a plurality of probe elements which are arranged to extend in the longitudinal direction of the wiring as well as in parallel with each other, each of probe elements being defined as one region of the film 112 in which there are included a plurality of projection electrodes 120, seat members 118, portions of wirings 114 and 116 in the vicinity of the projection electrode, and portions of film 112 in the vicinity of the projection electrode. Probe elements adjacent to each other may be separated from each other by means of notches or slits formed in the corresponding portion of the film 112.

Figure 13B:
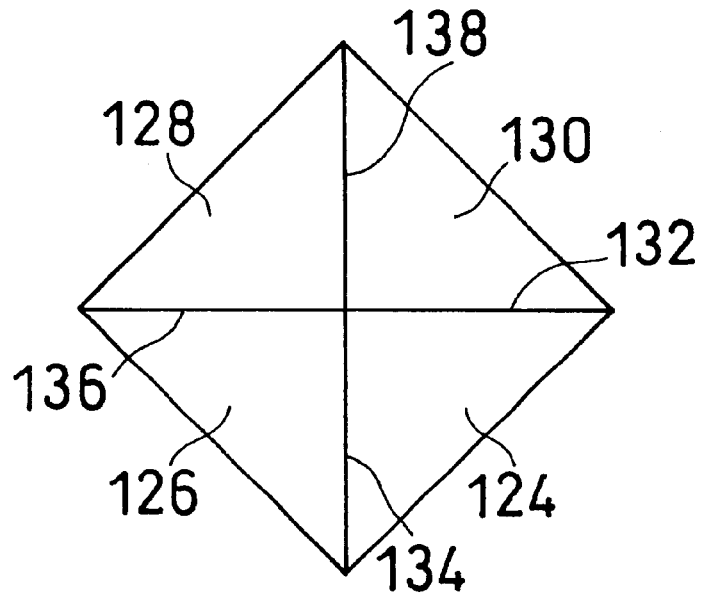
FIG. 13B is a perspective view of the projection electrode for use in explanation of the apex of the projection electrode shown in FIG. 11.
Figure 13A:
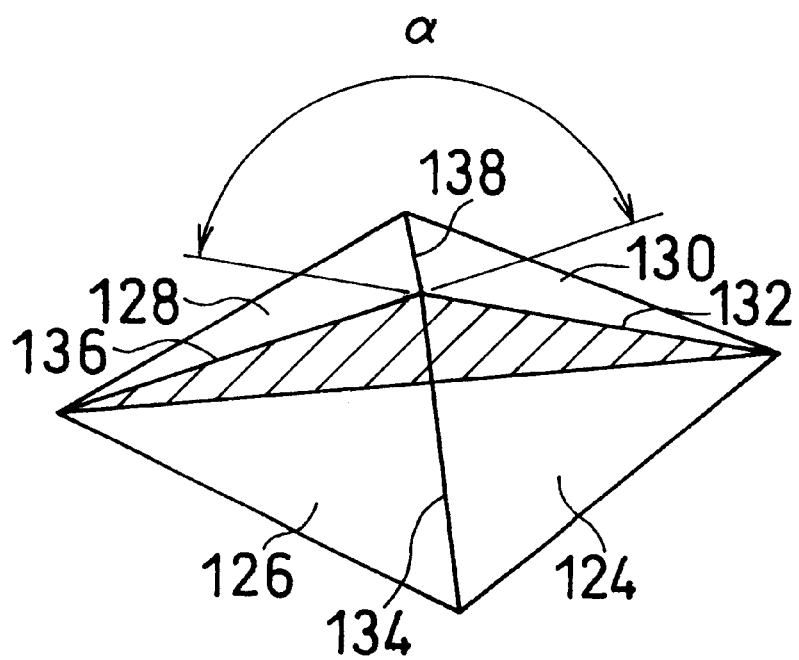
FIG. 13A is a plan view of the projection electrode for use in explanation of the projection electrode in the probe sheet shown in FIG. 11.

Each projection electrode 120 is made in the form of what we call a right quadrilateral pyramid having a square bottom surface as illustrated in FIGS. 12 and 13. Thus, each projection electrode 120 includes four slant planes 124, 126, 128, and 130 having the same shape, and four slant lines 132, 134, 136, and 138 defining a boundary line between two slant planes adjacent to each other.

Figure 14:
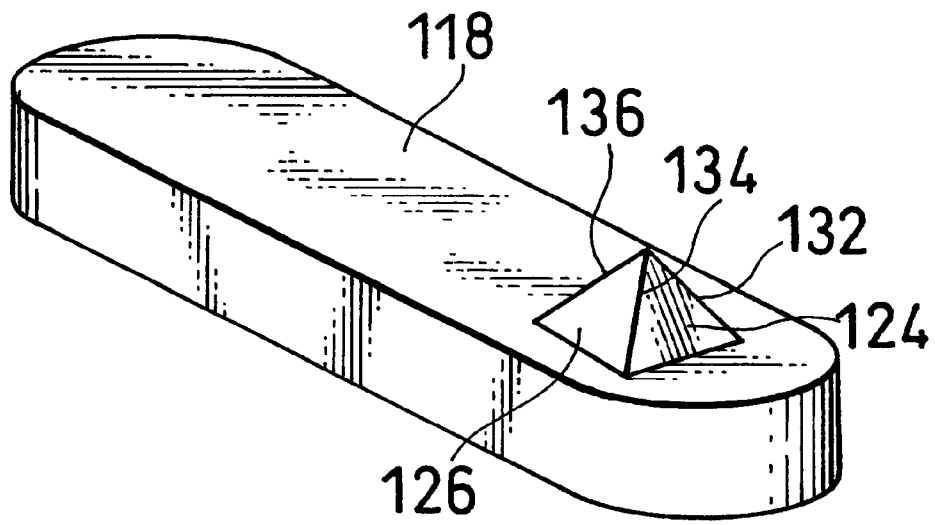
FIG. 14 is a perspective view of the second embodiment of the projection electrode mounted on the seat.

According to the example as shown in FIGS. 12 and 13, each projection electrode 120 is fitted to the seat member 118 such that two opposing slant lines, for instance slant lines 132 and 136 extend in the longitudinal direction of the probe element, especially the wirings 114 and 116 when viewing them from the apex side of the projection electrode 120. As shown in FIG. 14, however, each projection electrode 120 may be fitted to the seat member 118 such that two opposing slant planes, for instance, slant planes 124 and 128 are positioned to face in the longitudinal direction of the wirings 114 and 116 when viewing them from the apex side of the projection electrode 120.

An apex angle a made by the slant lines 132 and 136 extending in the longitudinal direction of the wirings 114 and 116 is made to have a value in the angular range of 120 through 165 degrees. In this example as shown in the figure, since the projection electrode 120 is formed as a right quadrilateral pyramid, the apex angle made by the corresponding slant lines 134 ad 138 also has a value in the angular range of almost 120 through 165 degrees. Each apex angle made by each of two pairs of the opposing slant planes 124, 128 and 126, 130 has a value in the angular range of almost 100 through 155 degrees.

Figure 15:
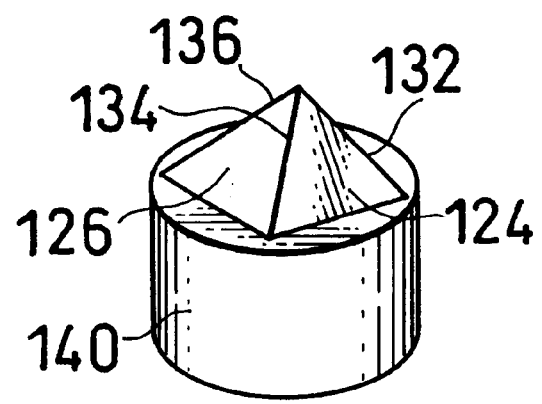
FIG. 15 is a perspective view showing the projection electrode mounted on the other embodiment of the seat.

Instead of using the elliptic type seat member 118, there may be used a seat member 140 (FIG. 15) of the cylinder type as adopted in the embodiment as discussed in connection with FIGS. 1 through 10. Furthermore, there may be used a square seat member identical or similar to the bottom surface of the projection electrode 120 or a rectangular seat member. In the same way, instead of using the elliptic type intermediate auxiliary member 122, there may be used an intermediate auxiliary member of the circular, square, or rectangular type. Still further, the first and second wirings 114 and 116 may be arranged on the same surface of the film 112. In this case, there is no need to use any intermediate auxiliary member.

When executing the electrical test of a flat plate type test-object such as an IC chip, the probe sheet 110 is relatively pressed on the test-object such that projection electrodes 120 of the probe sheet 110 are pressed on corresponding flat electrodes of the test-object, respectively. With this, as the apex portion of the projection electrode 120 pierces into the flat electrode of the test-object a little, the projection electrode 120 can make a sure electrical connection with the corresponding flat electrode of the test-object.

While the projection electrode 120 is relatively pressed on the corresponding flat electrode, a so-called a horizontal component force is generated because of such pressing force as one applied to the flat electrode and the shape of the projection electrode 120 having slant lines and slant planes. This component force acts on a part of the flat electrode to push it in the direction parallel with the test-object, especially the flat electrode thereof.

However, the horizontal component force like the above is smaller than what is called a vertical component force vertically acting on the test-object (especially, the flat electrode) because an oblique angle made by two opposing slant lines 132 and 136 has a value in the angular range of 120 through 165 degrees. As a result, the electrode material of the test-object is surely prevented from being swollen by the pressure applied to the flat electrode by the contactor, in other words, by the apex portion of the projection electrode 120 that is pierced into the flat electrode material.

Contrary to this, if the apex angle has a smaller value than 120 degrees, the horizontal component force becomes so large that the rise-up or swell of the electrode material takes place. Furthermore, if the apex angle has a value exceeding 165 degrees, the swell of the electrode material hardly takes place because the apex portion of the projection electrode 120 can hardly pierce into the flat electrode. Therefore, there is the possibility that the projection electrode 120 and the flat electrode might make an insufficient electrical connection therebetween.

In case that the two opposing slant lines 132 and 136 extend in the longitudinal direction of the wiring 114 (116) when viewing them from the apex of the projection electrode 120, even if the projection electrode 120 makes a displacement due to the overdrive of the projection electrode with respect to the flat electrode, this displacement direction of the projection electrode 120 becomes identical to the longitudinal direction of the two opposing slant lines 132 and 136, so that if the apex angle made by the slant lines 132 and 136 has a value in the angular range as mentioned above, the horizontal component force pushing a part of the flat electrode in the above displacement direction becomes so small that there is surely prevented the swell caused in the electrode material of the object under test by the pressure relatively applied between the projection electrode 120 and the flat electrode.

Furthermore, even if the two opposing slant planes 124 and 128 are directed to the longitudinal direction of the wiring 114 (116) when viewing them from the apex of the projection electrode 120 and the apex angle made by the slant planes 124 and 128 has a value in the angular range of almost 100 through 155 degrees, as far as the apex angle has a value in the angular range as mentioned above, the projection electrode 120 can surely make an electrical connection with the flat electrode similar to the above, and there is more surely prevented the swell caused in the electrode material of the object under test by the pressure relatively applied between the flat electrode and the projection electrode 120.

FIG. 16 illustrates various embodiments of the apex angle of the probe element, more particularly three examples of the apex angle α made by the two slant lines 132 and 136 extending in the longitudinal direction of the wiring and opposing to each other, and also the value of the apex angle β made by the two opposing slant planes 124 and 128 in correspondence with respective apex angles α.

Figure 16A:
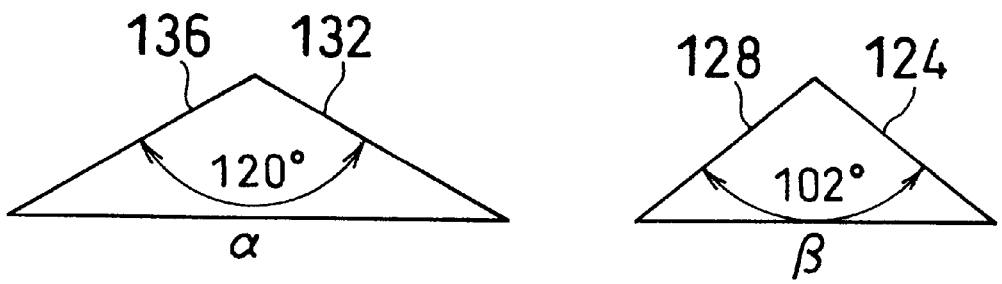
FIGS. 16A through 16C are illustrations showing various embodiments with respect to the apex angle.
Figure 16B:
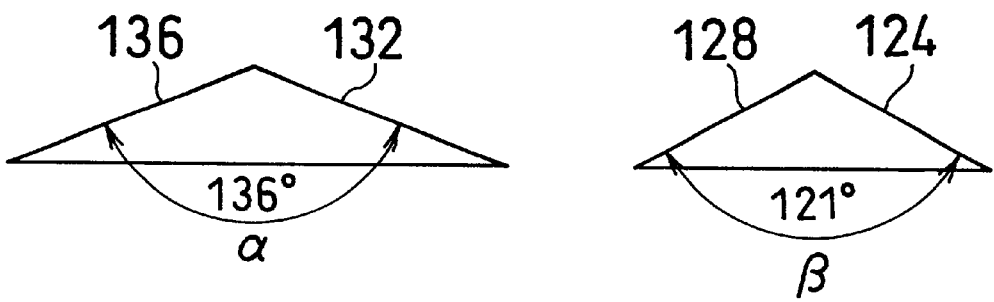
Figure 16C:
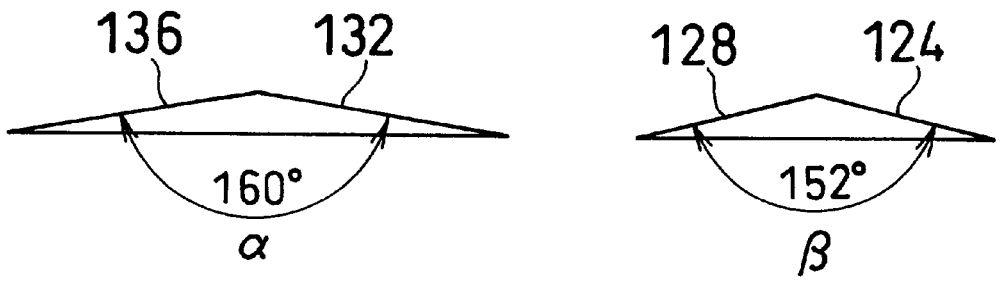

As shown in FIG. 16A, when the apex angle α made by the slant lines 132 and 136 is made to have a value of 120 degrees, the apex angle β becomes approximately 102 degrees. Furthermore, as shown in FIG. 16B, when the apex angle α made by the slant lines 132 and 136 is made to have a value of 136 degrees, the apex angle β becomes approximately 121 degrees. Still further, as shown in FIG. 16C, when the apex angle α made by the slant lines 132 and 136 is made to have a value of 160 degrees, the apex angle β becomes approximately 152 degrees.

Whatever apex angles as shown in FIG. 16 may be, despite the fact that the apex portion of the projection electrode 120 pierces into the flat electrode and makes a sure electrical connection between both of the above electrodes, the horizontal component force due to the relative pressure applied between the flat electrode and the projection electrode 120 is made smaller, so that there can be prevented the swell caused in the electrode material of the test-object by the relative pressure applied between the flat electrode and the projection electrode 120.

Figure 17:
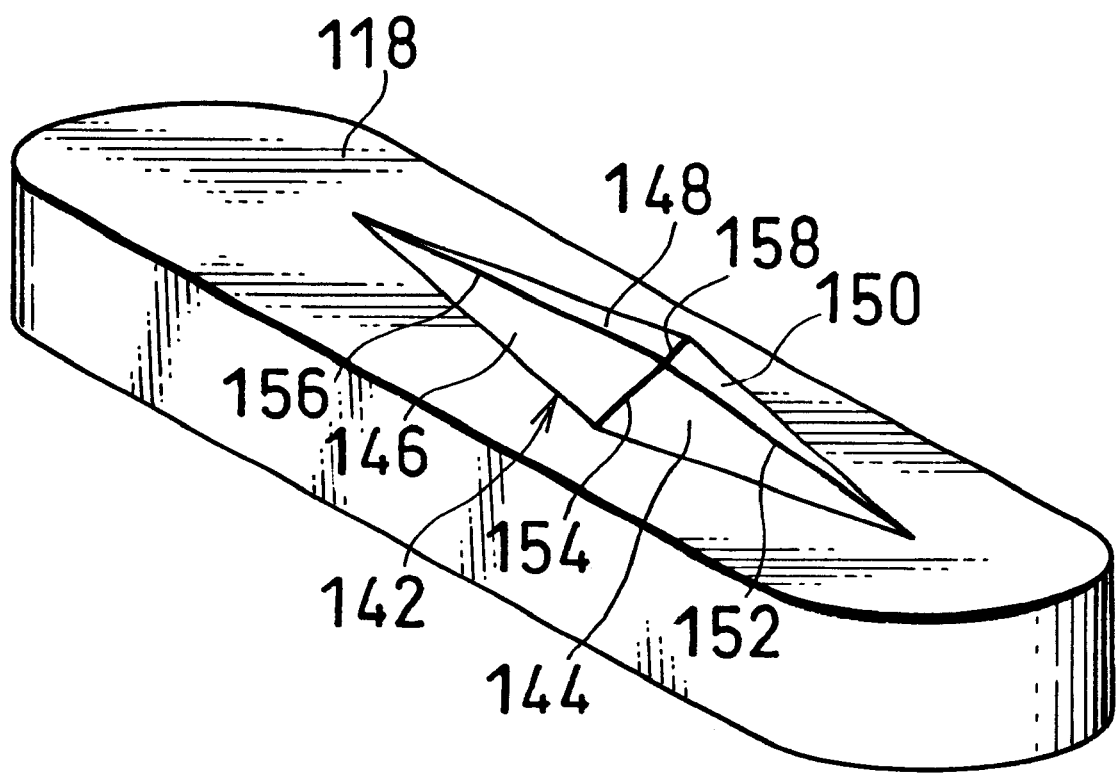
FIG. 17 is a perspective view showing the third embodiment of the projection electrode mounted on the seat.
Figure 18A:
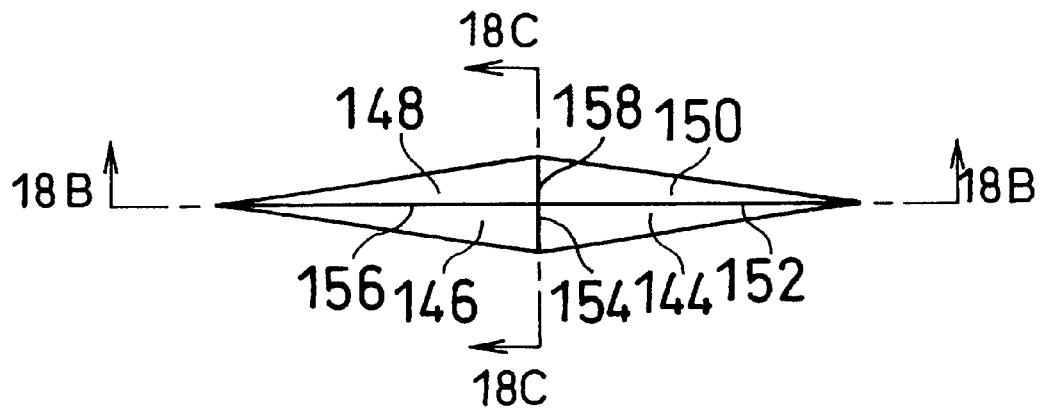
FIG. 18A is a plan view of the projection electrode for use in explanation of the projection electrode shown in FIG. 17.
Figure 18B:
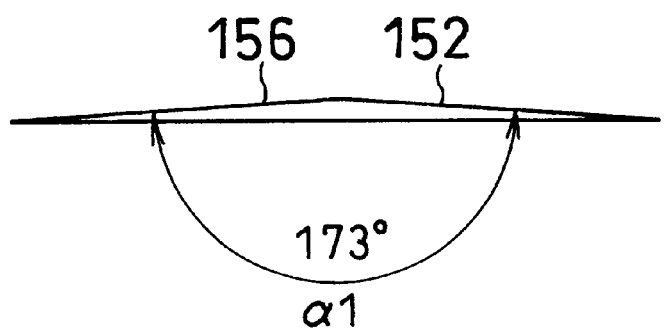
FIGS. 18B and 18C are perspective views of the projection electrode for use in explanation of the apex of the projection electrode shown in FIG. 17.
Figure 18C:
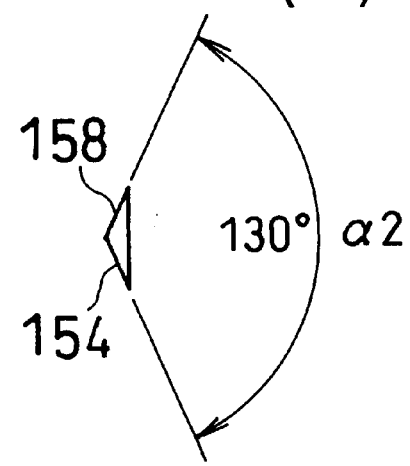

Referring to FIGS. 17 and 18, a projection electrode 142 has a shape of a so-called regular rhombus pyramid with a rhombic bottom surface. Therefore, the projection electrode 142 includes four slant planes 144, 146, 148, and 150 having an identical shape and four slant lines 152, 154, 156, and 158 of which each forms a boundary line between adjacent slant planes.

Two opposing longer slant lines 152 and 156 of the projection electrode 142 extend in the longitudinal direction of the probe element, especially the wiring when viewing them from the apex portion of the projection electrode 142. The apex angle α1 made by the slant lines 152 and 156 extending in the longitudinal direction of the wiring is made to have a value in the angular range of 170 through 175 degrees, preferably 173 degrees. An apex angle α2 made by the other two opposing shorter slant lines 154 and 158 is made acuter than the apex angle α1; for instance, it becomes almost 130 degrees when the apex angle α1 is 173 degrees.

With the projection electrode 142 as described above, because the angle α2 is made acuter than the angle α1, and because the two slant lines 152 and 156 extend in the direction of the displacement of the projection electrode 142 with respect to the flat electrode, the sure electrical connection between the projection electrode 142 and the flat electrode can be obtained even though the apex angle α1 has a value in the angular range of 170 through 175. In spite of achieving the sure electrical connection like this, there can be more surely prevented the swell caused in the electrode material of the test-object by the relative pressure applied between the flat electrode and the projection electrode 142.

Figure 19:
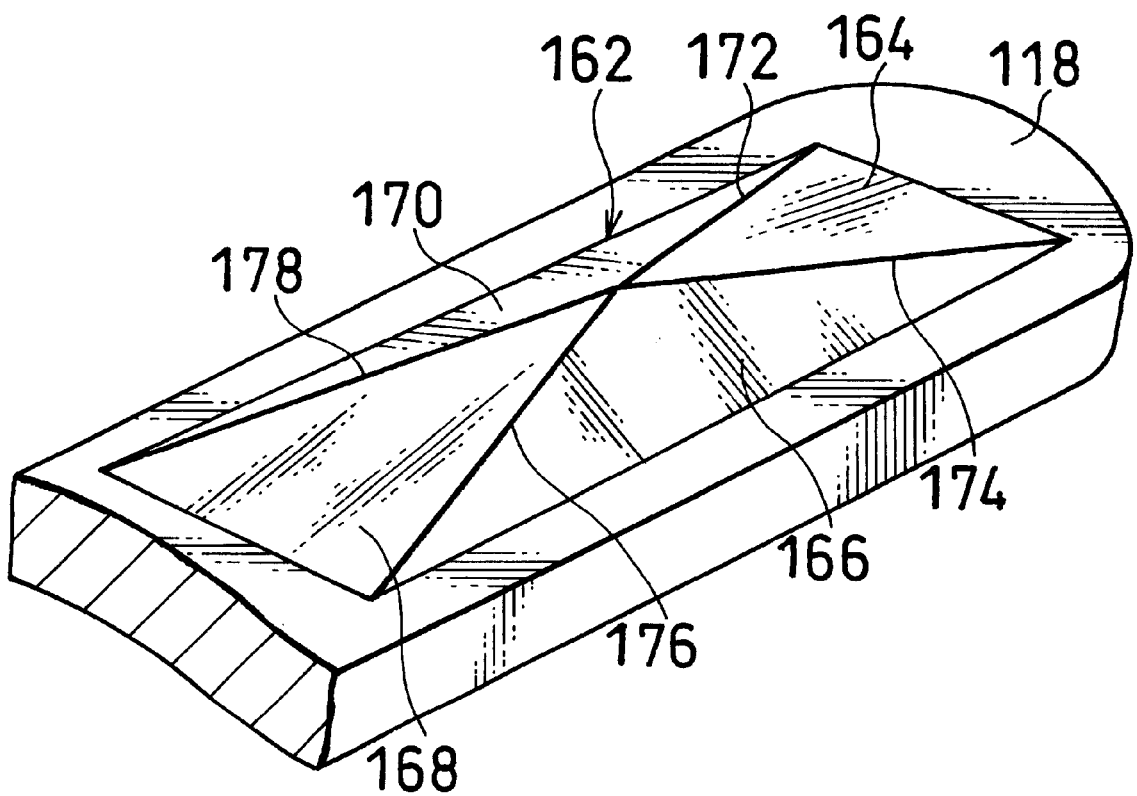
FIG. 19 is a perspective view showing the fourth embodiment of the projection electrode mounted on the seat.

Referring to FIG. 19, a projection electrode 162 has a so-called irregular pyramidal shape with a bottom surface of which the side lengths are different from each other. Therefore, the projection electrode 162 has four slant planes 164, 166, 168, and 170 and four boundary lines 172, 174, 176, and 178 forming a boundary line between the adjacent slant planes. The two opposing slant planes 164 and 168 are directed to the longitudinal direction of the probe element, especially the wiring when viewing them from the apex side of the projection electrode 162. An apex angle made by the slant planes 164 and 168 has a value in the angular range of 120 through 165 degrees.

If there is used the projection electrode 162 having such an apex angle as described above, despite that the projection electrode 162 surely makes the electrical connection with the flat electrode of the test-object, there can be prevented the swell caused in the electrode material of the test-object by the relative pressure applied between the flat electrode and the projection electrode 162, because the slant planes 164 and 168 are directed in the direction of the displacement of the projection electrode 162 with respect to the flat electrode, the displacement being caused due to the overdrive of the projection electrode.

In all the embodiments as have been discussed so far, the projection electrode is integrally formed with a seat of which the surface area is larger than the bottom surface area of the projection electrode, so that the seat having a large area can be mounted on the wiring or the intermediate auxiliary member. Therefore, the work for fitting the projection electrode to the wiring or the intermediate auxiliary member can be carried out with much ease in comparison with the case of fitting the projection electrode directly to the wiring or the intermediate auxiliary member. However, the projection electrode may be, of course, fitted directly to the wiring or the intermediate auxiliary member.

In all the embodiments as have been discussed so far, there has been adopted a pyramidal projection electrode. It may be allowed, however, to use a circular cone type or a polygonal pyramid type projection electrode if the apex angle thereof has a value in the angular range of 120 through 165 degrees, preferably 120 through 160 degrees. Even if there is used a contactor in the form of such a circular cone or polygonal pyramid, despite the fact that the projection electrode surely makes an electrical connection with the flat electrode of the test-object, there can be prevented the swell caused in the electrode material of the test-object by the relative pressure applied between the flat electrode and the projection electrode. Especially, in case of the contactor having a shape of the polygonal pyramid, it is preferable to set it up such that one slant line of the polygonal pyramid is directed to the direction of the displacement of the projection electrode when viewing it from the apex side of the projection electrode, the displacement being caused by the overdrive of the projection electrode.

The present invention is preferably applicable to the electrical test of a plurality of integrated circuits prepared on a semiconductor wafer prior to or after dividing them into an individual circuit by cutting. However, the invention is also applicable to the electrical test of the other flat plate-shaped test-object. Furthermore, the invention is applicable to the electrical test of the flat plate-shaped test-object provided with an electrode other than the flat electrode, for instance, a hemispherical projection electrode.

It is not always needed for entirety of the projection electrode as a contactor to have a shape of a pyramid, a circular cone, or the like. Only the apex portion of the projection electrode may have such a shape as described above. Furthermore, the seat 118 or the intermediate auxiliary member 122 is not always an indispensable component of the invention.

Needless to say, the invention should not be limited to the embodiments as have been described so far. Those who have an ordinary skill in the art may variously change and modify the above-mentioned embodiments without departing from the gist of the invention.

What is claimed is:

1. An electrical connection apparatus comprising
    a lattice comprising a first surface side, a second surface side and a plurality of openings arranged in each of the X- and Y- directions intersecting with each other; and a probe sheet, comprising a plurality of probe regions, separated from each other by at least one boundary portion defining a slit, wherein each probe region is positioned to correspond to each opening and wherein each probe region comprises a plurality of probe elements, each probe element having a contact portion wherein the probe sheet is arranged on the first surface side of the lattice such that each probe region is peripherally supported by the first side of the lattice, at least one contact portion is positioned to correspond to one opening, and the contact portions face away from the first surface side of the lattice, each probe element being independently and elastically deformable.

2. An electrical connection apparatus as claimed in claim 1 wherein each contact portion includes a projection electrode projecting away from the first surface side of said lattice.

3. An electrical connection apparatus as claimed in claim 1 further comprising a plurality of elastic members made of rubber or the like, wherein said probe sheet is further fitted to said elastic member.

4. An electrical connection apparatus as claimed in claim 3 further comprising a plurality of support members arranged on the second surface side of said lattice at a predetermined interval in either the X- or Y-direction, and in contact with said elastic members, and a base plate to which said support members are fitted.

5. An electrical connection apparatus as claimed in claim 4 wherein at least said lattice is made of a material of which the thermal expansion coefficient is smaller than that of a semiconductor wafer.

6. An electrical connection apparatus as claimed in claim 4 wherein said support members project from said lattice to said probe sheet.

7. An electrical connection apparatus as claimed in claim 1 further comprising a plurality of wires passing through said lattice, each wire being electrically connected with each probe element.

8. An electrical connection apparatus as claimed in claim 7 further comprising one or more film-like connection base plates having a plurality of wiring lines of which each is connected with said wire.

9. An electrical connection apparatus as claimed in claim 1 further comprising a plate-like elastic member arranged in each opening of said lattice, and a plurality of support members arranged on the second surface side of said lattice at a predetermined interval in either the X- or Y-direction, and in contact with said elastic members, wherein each support member has a groove extended in longitudinal direction of said the support member and opened on the side of said elastic members to receive a part of said elastic member, each probe element is formed like a cantilever by one or more first slits formed in said probe sheet, and each elastic member has a plurality of second slits at least in a portion thereof received in said groove, each second slit corresponding to said first slit.

10. An electrical connection apparatus as claimed in claim 9 wherein there is formed a space between a part of said elastic member and the bottom surface of said groove.

11. An electrical connection apparatus as claimed in claim 2 wherein said projection electrode has a conical or pyramidal shape.

12. An electrical connection apparatus as claimed in claim 11 wherein said projection electrode has an apex angle with a value in the angular range of 100 through 175 degrees.

13. An electrical connection apparatus as claimed in claim 11 wherein said projection electrode has a pyramidal shape with a plurality of slant planes and a plurality of slant lines, and wherein one slant line thereof is directed to the displacement direction of said projection electrode when viewing it from the apex side of said projection electrode, the displacement being caused by the overdrive of the projection electrode.

14. An electrical connection apparatus as claimed in claim 12 wherein said projection electrode has a regular quadrilateral pyramidal shape, and wherein two opposing slant lines of said quadrilateral pyramid extend in the longitudinal direction of said probe element including said projection electrode when viewing them from the apex side of said projection electrode, and form said apex angle with a value in the angular range of 120 through 165 degrees.

15. An electrical connection apparatus as claimed in claim 12 wherein said projection electrode has a regular quadrilateral pyramidal shape, and wherein two opposing slant planes of said quadrilateral pyramid are directed to the longitudinal direction of said probe element including said projection electrode when viewing them from the apex side of said projection electrode, and form said apex angle with a value in the angular range of 100 through 155 degrees.

16. An electrical connection apparatus as claimed in claim 12 wherein said projection electrode has a rhombic pyramidal shape with two each of longer and shorter slant lines, and wherein two opposing longer slant lines thereof extend in the longitudinal direction of said probe element including said projection electrode when viewing them from the apex side of said projection electrode, and form said apex angle with a value in the angular range of 170 through 175 degrees.

17. An electrical connection apparatus as claimed in claim 16 wherein two opposing shorter slant lines form an apex angle with a value in the angular range of 125 through 135 degrees.

18. An electrical connection apparatus as claimed in claim 12 wherein said projection electrode has an irregular rhombic pyramidal shape, and wherein two opposing slant planes are larger than the other two opposing slant planes with respect to the length from the bottom surface side of said pyramid to the apex thereof and are directed to the longitudinal direction of said probe element including said projection electrode when viewing them from the apex side of said projection electrode, and form said apex angle with a value in the angular range of 120 through 165 degrees.

* * * * *